(12) United States Patent
Jiang et al.

(10) Patent No.: US 11,380,378 B1
(45) Date of Patent: Jul. 5, 2022

(54) CLOCK DRIVER AND MEMORY DEVICE COMPRISING THE SAME

(71) Applicant: MONTAGE TECHNOLOGY (KUNSHAN) CO., LTD, Suzhou (CN)

(72) Inventors: Yibo Jiang, San Jose, CA (US); Leechung Yiu, San Jose, CA (US); Christopher Cox, San Jose, CA (US); Lizhi Jin, San Jose, CA (US)

(73) Assignee: MONTAGE TECHNOLOGY (KUNSHAN) CO., LTD., Suzhou (CN)

( * ) Notice: Subject to any disclaimer, the term of this patent is extended or adjusted under 35 U.S.C. 154(b) by 0 days.

(21) Appl. No.: 17/485,415

(22) Filed: Sep. 25, 2021

(51) Int. Cl.
*G11C 7/22* (2006.01)
*H03L 7/07* (2006.01)
*H03L 7/081* (2006.01)
*G06F 1/06* (2006.01)

(52) U.S. Cl.
CPC ............... *G11C 7/222* (2013.01); *H03L 7/07* (2013.01); *G06F 1/06* (2013.01); *H03L 7/0814* (2013.01)

(58) Field of Classification Search
None
See application file for complete search history.

(56) References Cited

U.S. PATENT DOCUMENTS 7,170,319 B1 * 1/2007 Stiff .................... H03K 5/1565
326/86
10,958,277 B1 * 3/2021 Olariu .................. H03L 7/0996

* cited by examiner

*Primary Examiner* — Cassandra F Cox
(74) *Attorney, Agent, or Firm* — Jun He Law Offices P.C.; James J. Zhu

(57) ABSTRACT

A clock driver comprises: a clock detector for receiving a plurality pairs of input clock signals of a predetermined clocking protocol, and for generating a protocol identifier indicative of the predetermined clocking protocol; a phase locking loop (PLL) module coupled to receive at least one pair of the plurality pairs of input clock signals, and for generating at least one pair of reference clock signals according to the received at least one pair of input clock signal; and a plurality of multiplexers coupled to the clock detector and to the PLL module. Each multiplexer is configured for receiving one pair of the plurality pairs of input clock signals and one pair of the at least one pair of reference clock signals, and selectively outputting, according to the protocol identifier, the pair of input clock signals and the pair of reference clock signals to drive a group of memory chips.

19 Claims, 4 Drawing Sheets

US 11,380,378 B1

CLOCK DRIVER AND MEMORY DEVICE COMPRISING THE SAME

TECHNICAL FIELD

The present application generally relates to memory technology, and more particularly, to a clock driver and a memory device comprising such clock driver.

BACKGROUND

A dual in-line memory module (DIMM) is a memory module that integrates multiple memory chips (e.g., dynamic random access memory (DRAM) chips) on a substrate (e.g., a printed circuit board (PCB)), which is also called as raw card.

Some types of DIMMs such as unbuffered dual inline memory modules (UDIMMs) and small outline dual inline memory modules (SODIMMs) are generally used in personal computers and laptop computers, and thus do not have a centralized clock driver that can generate clock signals for coordinating the operation of sets of memory chips on the DIMMs. These DIMMs generally receive clock signals directly from an external host controller such as a central processing unit (CPU). However, due to the continued increase in the frequency of clock signals, more severe jittering problem may occur to the clock signals when they are received by the sets of memory chips on the DIMMs. Therefore, a clock driver may be added onto the DIMM and coupled between the host controller and the sets of memory chips. The host controller may provide clock signals differently from those conventional clock signals for driving DIMMs without on-board clock drivers.

Therefore, it is desired that the DIMMs with on-board clock drivers can work properly with either of the host controllers providing the different clock signals, so as to resolve the backward compatibility problem.

SUMMARY

An objective of the present application is to provide a clock driver that allows DIMMs with the clock driver can work with both conventional host controllers sending clock signals directly to memory chips of the DIMMs and new host controllers sending clock signals to memory chips of the DIMMs via the clock driver.

In an aspect of the present application, there is provided a clock driver. The clock driver comprises: a clock detector for receiving a plurality pairs of input clock signals of a predetermined clocking protocol, and for generating a protocol identifier indicative of the predetermined clocking protocol by determining toggling of the plurality pairs of input clock signals; a phase locking loop (PLL) module coupled to receive at least one pair of the plurality pairs of input clock signals, and for generating at least one pair of reference clock signals according to the received at least one pair of input clock signal; and a plurality of multiplexers coupled to the clock detector and to the PLL module, wherein each multiplexer is configured for receiving one pair of the plurality pairs of input clock signals and one pair of the at least one pair of reference clock signals, and selectively outputting, according to the protocol identifier, the pair of input clock signals and the pair of reference clock signals to drive a group of memory chips.

In another aspect of the present application, there is provided a memory device comprising the clock driver and a plurality groups of memory chips.

In a further aspect of the present application, there is provided a method for clocking a memory device, wherein the method comprises: receiving a plurality pairs of input clock signals of a predetermined clocking protocol; generating a protocol identifier indicative of the predetermined clocking protocol by determining toggling of the plurality pairs of input clock signals; and selectively outputting, according to the protocol identifier, the plurality pairs of input clock signals or a plurality of reference clock signals generated according to at least one pair of input clock signals.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE EMBODIMENTS

Figure 1:
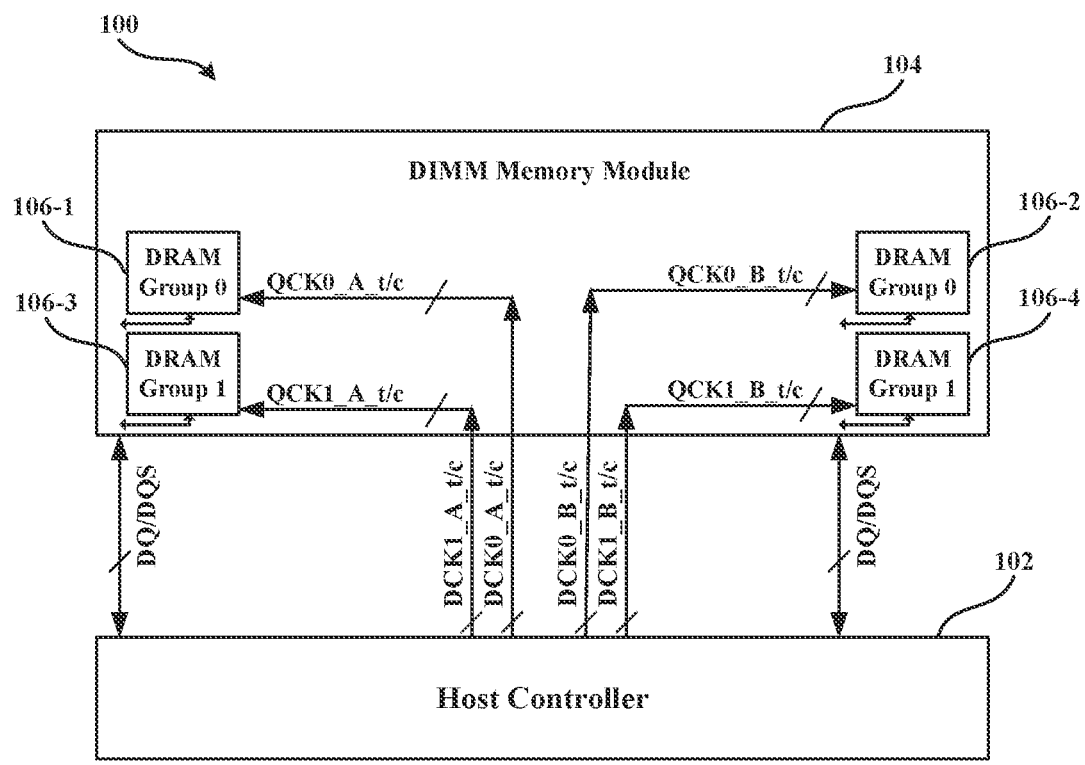
FIG. 1 shows an existing memory device 100.

In the following detailed description, reference is made to the accompanying drawings which form a part hereof. In the drawings, similar reference numerals generally refer to similar parts unless the context clearly dictates otherwise. The illustrative embodiments described in the detailed description, drawings and claims are not intended to be limiting. Other embodiments may be employed and other changes may be made without departing from the spirit or scope of the subject matter of the present application. It is to be understood that various configurations, substitutions, combinations and designs of the various forms of the present application, which are generally described in this application and are illustrated in the drawings, are intended to constitute a part of the present application.

FIG. 1 shows an existing memory device 100. The memory device 100 may be coupled to a host controller 102 such as a central processing unit (CPU) to exchange data with the host controller 102. Specifically, the host controller 102 may access to the memory device 100 by providing, for example, a write instruction of writing data into the memory device 100, or a read instruction of reading data from the memory device 100. In certain embodiments, the memory device 100 may be a memory device in accordance with the JEDEC double data rate synchronous dynamic random access memory (DDR SDRAM) standards, including the JEDEC DDR2, DDR3, DDR4, DDR5 or any other suitable DDR standards, for example.

Figure 2:
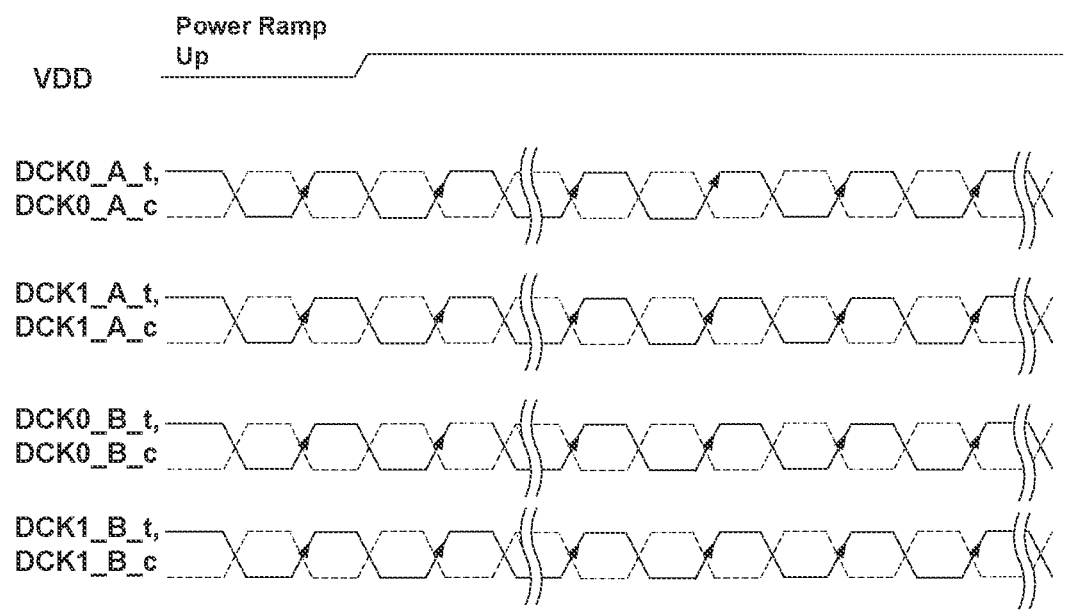
FIG. 2 shows waveforms of four pairs of input clock signals DCK0_A_t/c, DCK0_B_t/c, DCK1_A_t/c and DCK1_B_t/c used in the memory device 100 in FIG. 1.

As shown in FIG. 1, the memory device 100 includes a DIMM memory module 104, which stores data therein during operation and accessible by the host controller 102. It can be appreciated that more DIMM memory modules may be included in the memory device 100 and accessible by the host controller 102, which are the same as or similar to the DIMM memory module 104. The DIMM memory module 104 may include a plurality of groups of DRAM memory chips, e.g., four groups of DRAM memory chips 106-1 to 106-4 as shown in FIG. 1. In some other embodiments, the DIMM memory module 104 may include two or more groups of memory chips. Since the DIMM memory module 104 does not have an on-board clock driver, a plurality pairs of input clock signals DCK0_A_t/c, DCK0_B_t/c, DCK1_A_t/c and DCK1_B_t/c are directly transmitted from the host controller 102 to the plurality groups of DRAM memory chips 106-1 to 106-4, with each pair of input clock signals driving a group of DRAM memory chips. For example, the first pair of input clock signals DCK0_A_t/c may be transmitted to the first group of memory chips 106-1, and the second pair of input clock signals DCK0_B_t/c may be transmitted to the second group of memory chips 106-2. Each pair of input clock signals includes a differential pair of clock signals. It can be appreciated by a person skilled in the art that the four pairs of input clock signals may be buffered or otherwise conditioned in a manner that does not substantially change the toggling of the signals, and thus the input clock signals are shown in FIG. 2 as four pairs of clock signals QCK0_A_t/c, QCK0_B_t/c, QCK1_A_t/c and QCK1_B_t/c when they are received by the groups of memory chips 106-1 to 106-4, respectively. The groups of memory chips are also coupled to the host controller via respective data buses DQ/DQS as shown in FIG. 1. In an embodiment, the DIMM memory module 104 may be an unbuffered dual inline memory module (UDIMM) or a small outline dual inline memory module (SODIMM).

FIG. 2 shows waveforms of the four pairs of input clock signals DCK0_A_t/c, DCK0_B_t/c, DCK1_A_t/c and DCK1_B_t/c used in the memory device 100 in FIG. 1. The four pairs of input clock signals are in compliance with a first clocking protocol. As shown in FIG. 2, since the four pairs of input clock signals are separately transmitted from the host controller to the groups of memory chips, each pair of input clock signals may toggle independently from the other pairs of input clock signals.

Figure 3:
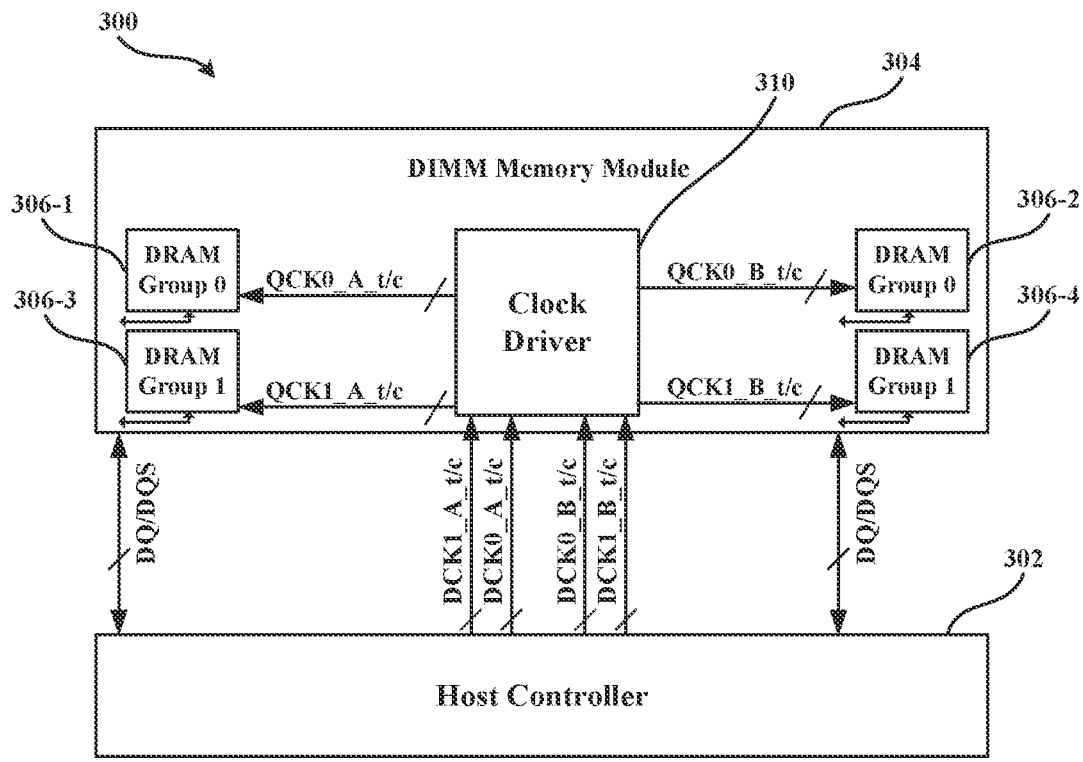
FIG. 3 shows a memory device 300 according to an embodiment of the present application.

FIG. 3 shows a memory device 300 according to an embodiment of the present application. As shown in FIG. 3, the memory device 300 may be coupled to a host controller 302 to exchange data with the host controller 302. The memory device 300 includes a DIMM memory module 304 or one or more additional DIMM memory modules (not shown) which are accessible by the host controller 302.

In an embodiment, the DIMM memory module 304 may include a plurality groups of DRAM memory chips, e.g., four groups of DRAM memory chips 306-1 to 306-4 as shown in FIG. 3. In some other embodiments, the DIMM memory module 304 may include two or more groups of memory chips. Furthermore, a clock driver 310 is integrated within the DIMM memory module 304 and coupled between the groups of memory chips 306-1 to 306-4 and the host controller 302. The clock driver 310 can receive a plurality pairs of input clock signal DCK0_A_t/c, DCK0_B_t/c, DCK1_A_t/c and DCK1_B_t/c from the host controller 302 and then provide to the groups of DRAM memory chips 306-1 to 306-4 a plurality pairs of output clock signals QCK0_A_t/c, QCK0_B_t/c, QCK1_A_t/c and QCK1_B_t/c, with each pair of output clock signals driving a group of DRAM memory chips. The generation of the pairs of output clock signals QCK0_A_t/c, QCK0_B_t/c, QCK1_A_t/c and QCK1_B_t/c will be elaborated below with more details.

As mentioned above, for some new host controllers that are designed for use with the memory device 300 shown in FIG. 3, the pairs of input clock signals issued by the new host controllers may be in a format different from that shown in FIG. 2, because it is desired that the input clock signals be processed substantially to mitigate the jittering problem at the DIMM memory module.

Figure 4:
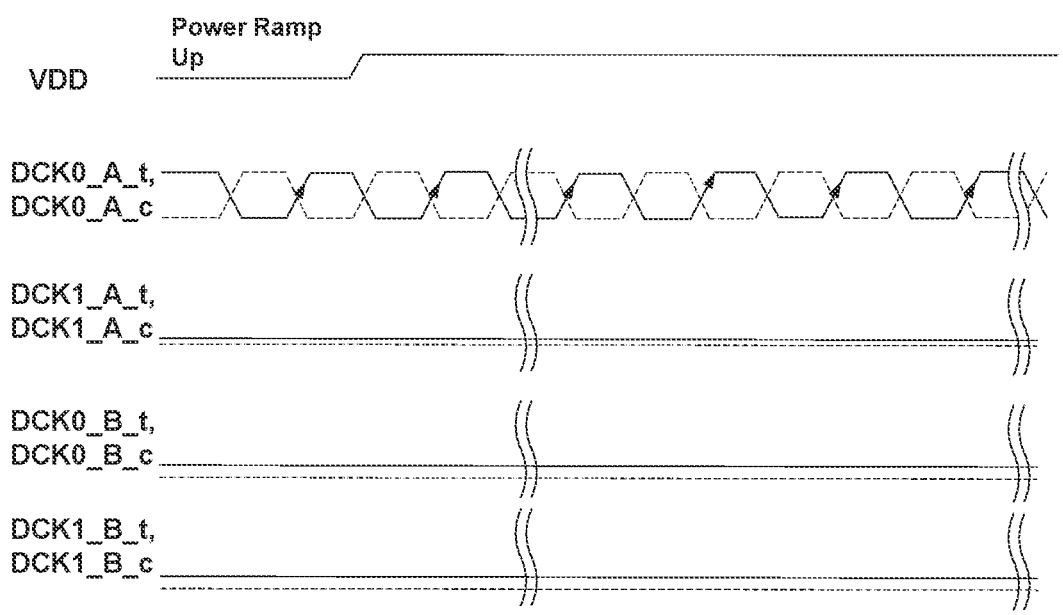
FIG. 4 shows waveforms of four pairs of input clock signals used in the memory device 300 in FIG. 3.

Specifically, in some cases, the host controller 302 may provide to the clock driver 310 a plurality of input clock signals of a second clocking protocol, as shown in FIG. 4. In the embodiment shown in FIG. 4, the host controller may rely on the clock driver in the DIMM memory module 304 to generate pairs of reference clock signals, to avoid undesired jittering introduced by a signal path between the host controller and the clock driver, which may be significant in a high-frequency clocking environment. For example, the clock driver can include a phase locking loop (PLL) module to generate the pairs of reference clock signals based on at least one pair of input clock signals. Accordingly, not all of the plurality pairs of input clock signals DCK0_A_t/c, DCK0_B_t/c, DCK1_A_t/c and DCK1_B_t/c need to toggle during the operation of the memory device. For example, as shown in FIG. 4, only the pair of input clock signals DCK0_A_t/c is toggling and the other three pairs of input clock signals DCK0_B_t/c, DCK1_A_t/c and DCK1_B_t/c are not toggling, e.g. maintained at a LOW voltage or at a HIGH voltage (not shown). However, in some other cases, when the memory device 300 is coupled to an existing host controller, the host controller may provide to the clock driver a plurality pairs of input clock signals which may be similar to those pairs of input clock signals as shown in FIG. 2. That is, the pairs of input clock signals may be in compliance with the first clocking protocol that requires such pairs of input clock signals toggle independently from each other in order to drive the respective groups of memory chips.

In order to distinguish between the pairs of input clock signals of the first clocking protocol (e.g. the signals shown in FIG. 2) and the pairs of input clock signals of the second clocking protocol (e.g. the signals shown in FIG. 4), the clock driver 310 may employ a clock detection mechanism for detecting the toggling of the pairs of input clock signals, before sending the desired clock signals to the groups of memory chips. Accordingly, the clock driver 310 may select to output different clock signals to the groups of memory chips according to the detection result. For example, the clock driver may select to output to the groups of DRAM memory chips the received pairs of input clock signals when it is determined that the pairs of input signals are of the first clocking protocol, or output to the groups of DRAM memory chips the generated pairs of references clock signals when it is determined that the pairs of input signals are of the second clocking protocol. The clock detection mechanism provides backward compatibility for the memory devices with such clock driver.

Figure 5:
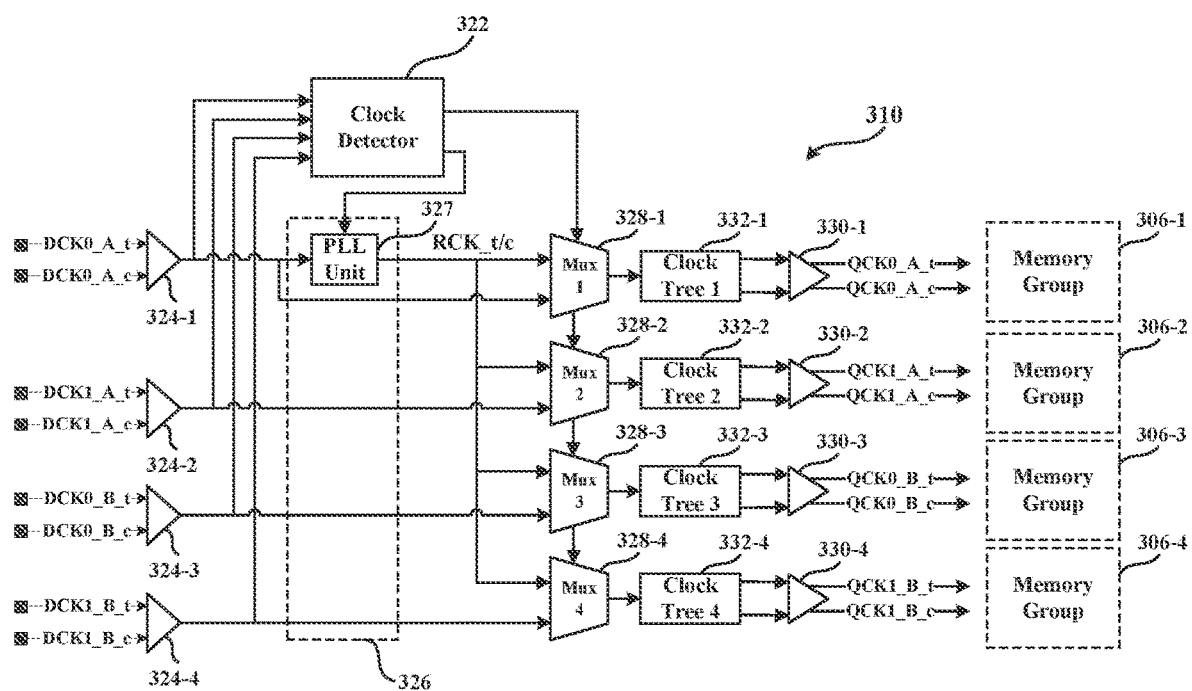
FIG. 5 shows an exemplary schematic diagram of the clock driver 310 in the memory device 300 of FIG. 3 according to an embodiment of the present application.

FIG. 5 shows an exemplary schematic diagram of the clock driver 310 in the memory device 300 of FIG. 3 according to an embodiment of the present application.

As shown in FIG. 5, the clock driver 310 includes a clock detector 322 for detecting the clock signals received from the host controller (not shown). In the example, the clock detector 322 is coupled to receive four pairs of input clock signals DCK0_A_t/c, DCK0_B_t/c, DCK1_A_t/c and DCK1_B_t/c via four input buffers 324-1 to 324-4, respectively. The clock detector 322 can determine the toggling of the four pairs of input clock signals so as to generate a protocol identifier. The protocol identifier can be indicative of the predetermined clocking protocol with which the plurality pairs of input clock signals are in compliance. For example, the protocol identifier may be a one-bit flag having a value of "0" or "1", with the value "0" indicative of the first clocking protocol as shown in FIG. 2 and the value "1" indicative of the second clocking protocol as shown in FIG. 4. It can be appreciated that the protocol identifier can include more information and may be in any other suitable formats. For example, in some examples, the pair of input clock signals DCK0_A_t/c may toggle but the other pairs may not toggle, and in some other examples, the pair of input clock signals DCK0_B_t/c may toggle but the other pairs may not toggle. Accordingly, the clock detector 322 may further identify which pair of input clock signals are toggling and generate a protocol identifier indicating such information. In some embodiments, the clock driver 310 may count a number of clock cycles for each pair of input clock signals within a detection period, so as to determine whether the detected pairs of input clock signals are toggling at a desired frequency. In some other embodiments, the clock driver 310 may count a clock frequency for each pair of input clock signals with a detection period, so as to determine whether the detected pairs of input clock signals are toggling at the desired frequency. If it is detected that the pair of input clock signals are not toggling at all or at a frequency different from the desired frequency, a corresponding protocol identifier may be generated.

Still referring to FIG. 5, the clock driver 310 further includes a phase locking loop (PLL) module 326. The PLL module 326 may receive at least one pair of the plurality pairs of input clock signals, and generate at least one pair of reference clock signals according to the received at least one pair of input clock signal. Any suitable PLL circuitry may be used for the PLL module 326. It can be appreciated that the PLL module may at least be coupled to receive the toggling pair of input clock signals as required by the second clocking protocol. In the embodiment shown in FIG. 5, the PLL module 326, or specifically, the PLL unit 327, receives the pair of input clock signal DCK0_A_t/c and generates a pair of reference clock signals RCK_t/c. Furthermore, although it is shown in FIG. 5 that the PLL module 326 includes only one PLL unit 327 which is coupled to the input buffer 324-1, more PLL units may be included in the PLL module 326 and coupled to a respective one of the input buffers 324-2 to 324-4. For example, another PLL unit (not shown) may be coupled to the input buffer 324-3 to receive the pair of input clock signals DCK0_B_t/c. If two or more PLL units are included in the PLL module, they may generate different pairs of reference clock signals (e.g. the pairs of reference clock signals can have different frequencies), or a further selection may be set to select a preferred pair of reference clock signals therefrom. Furthermore, in some embodi- ments, the clock detector 322 may be further coupled to the PLL module 326 to send the protocol identifier thereto. In this way, the PLL module 326 may be disabled to save power when it is detected that all the pairs of input clock signals are toggling normally or at the desired frequency. Also, although the PLL unit 327 is shown in FIG. 5 to receive the pair of input clock signals DCK0_A_t/c, in some other embodiments, the PLL unit 327 may be alternatively coupled to any one of the other pairs of input clock signals DCK0_B_t/c, DCK1_A_t/c or DCK1_B_t/c, depending on how the second clocking protocol defines the clock signals received from the host controller.

A plurality of multiplexers 328-1 to 328-4 are included in the clock driver 310 to selectively output the input clock signals and the reference clock signals. Specifically, each multiplexer has a first input that is coupled to an input buffer to receive a pair of input clock signals, and a second input that is coupled to the PLL module 326 to receive the pair of reference clock signals generated by the PLL module 326. Each multiplexer further has a control node coupled to the clock detector 322 to receive the protocol identifier and an output that selectively outputs the pair of input clock signals or the pair of reference clock signals according to the protocol identifier. For example, when the received protocol identifier is indicative of the first clocking protocol as shown in FIG. 2, all the multiplexers 328-1 to 328-4 may output the pairs of input clock signals DCK0_A_t/c, DCK0_B_t/c, DCK1_A_t/c and DCK1_B_t/c via four output buffers 330-1 to 330-4, respectively, and then to the respective groups of memory chips 306-1 to 306-4. That is, all the first inputs of the multiplexers are enabled. In this case, the clock driver 310 does not substantially change the pairs of input clock signals received from the host controller, and allows the input clock signals "transparently" pass through it. Therefore, the groups of memory chips 306-1 to 306-4 disposed on the DIMM memory module where the clock driver 310 is also disposed can be driven by the desired pairs of input clock signals accordingly. Conversely, when the received protocol identifier is indicative of the second clocking protocol as shown in FIG. 4, the multiplexers 328-1 to 328-4 may stop outputting the pairs of input clock signals. Rather, the multiplexers 328-1 to 328-4 may be controlled to output the pairs of reference clock signals to the groups of memory chips 306-1 to 306-4. That is, all the second inputs of the multiplexers are enabled. In this case, since the reference clock signals RCK_t/c are newly generated by the PLL module 326, clock jittering that may occur to the received input clock signals can be addressed significantly by the PLL module. Therefore, the groups of memory chips 306-1 to 306-4 mounted on the DIMM memory module can be driven properly by the reference clock signals RCK_t/c at a higher frequency, without the jittering of the clock signals being an issue.

In some embodiments, one or more clock trees may be coupled between the multiplexers and the output buffers. In the embodiment shown in FIG. 5, four clock trees 332-1 to 332-4 are coupled between the multiplexers 328-1 to 328-4 and the output buffers 330-1 to 330-4, respectively. Each clock tree may introduce an offset into the pair of reference clock signals passing therethrough, so that the pairs of reference clock signals outputted by the clock driver 310 may have different offsets that may be desired by different groups of memory chips. It can be appreciated that less clock trees may be used in some other embodiments. In some other embodiments, other functional modules such as frequency dividers or frequency multipliers may be coupled to the outputs of the multiplexers 328-1 to 328-4 to reduce or increase the frequency of the reference clock signals.

Figure 6:
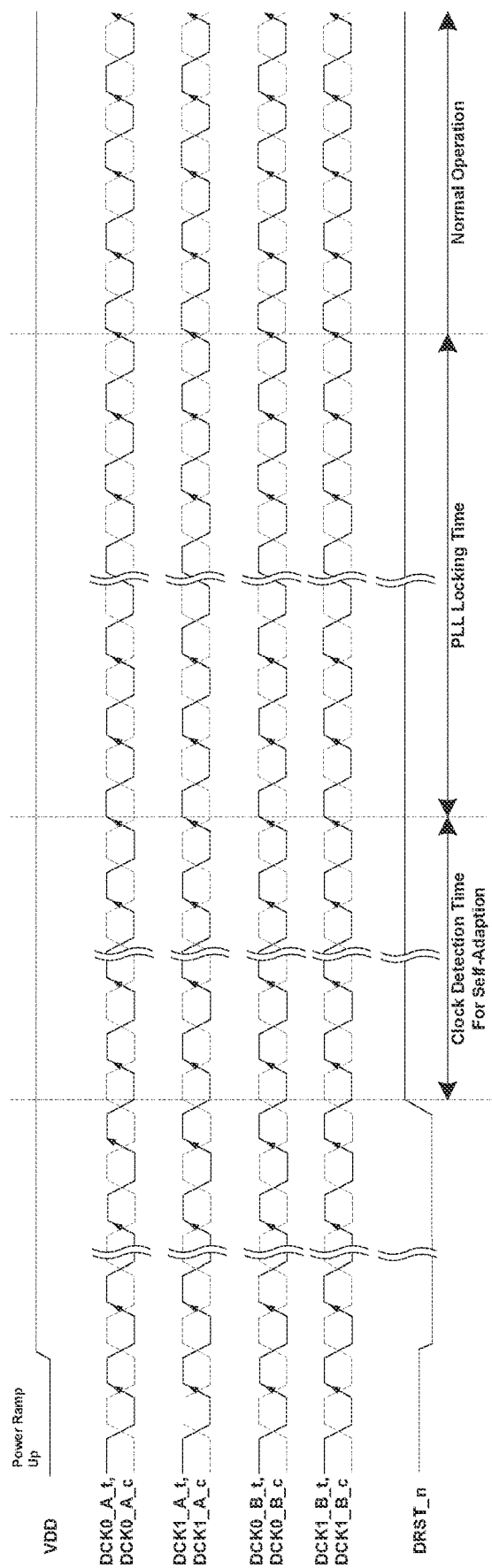
FIG. 6 shows an initialization process implemented by a clock driver according to an embodiment of the present application.

FIG. 6 shows an initialization process implemented by a clock driver according to an embodiment of the present application. In the following, the process will be described with reference to the clock driver shown in FIG. 5.

After power-on (power ramps up) of the system, a reset control signal DRST_n may transit from a LOW voltage to a HIGH voltage for the first time, which functions as a power-on signal indicating that the initialization process starts. Upon receipt of the transition, the clock detector 322 of the clock driver 310 may detect the toggling of the pairs of input clock signals DCK0_A_t/c, DCK0_B_t/c, DCK1_A_t/c and DCK1_B_t/c received at its input buffers 324-1 to 324-4, to perform self-adaption for the input clock signals. The clock detection may take several cycles of the input clock signals.

If it is detected that the pairs of input clock signals DCK0_A_t/c, DCK0_B_t/c, DCK1_A_t/c and DCK1_B_t/c are all toggling, or two pairs DCK0_A_t/c and DCK0_B_t/c are both toggling, or one pair of DCK0_A_t/c and DCK1_A_t/c and another pair of DCK0_B_t/c and DCK1_B_t/c (which is defined in some protocols) are both toggling, then the clock driver 310 may enter a PLL bypass mode and sets the protocol identifier output by the clock detector 322 to the first protocol identifier. In this PLL bypass mode, the pairs of input clock signals may be transparently forwarded by the clock driver 322 to drive the respective pairs of output clock signals QCK0_A_t/c, QCK0_B_t/c, QCK1_A_t/c and QCK1_B_t/c separately. In some cases where only two pairs of input clock signals DCK0_A_t/c and DCK0_B_t/c are toggling, these two pairs of input clock signals may be transparently forwarded by the clock driver 322 to drive the two pairs of output clock signals QCK0_A_t/c and QCK0_B_t/c separately, and the output clock signals QCK1_A_t/c and QCK1_B_t/c may be disabled. When the host controller adjusts the phase of a pair of the input clock signals, the phase of the corresponding pair of output clock signals can be adjusted with the same offset. In some embodiments, input bus termination resistors on the pairs of input clock signals may be all connected to the positive supply power VDD with programmable values.

If it is detected that only one pair of input clock signals is toggling, for example, only the first pair of input clock signals DCK0_A_t/c is toggling and the other three pairs of input clock signals are all kept either at the LOW voltage or at the HIGH voltage, then the clock driver may enter a PLL normal mode and sets the protocol identifier output by the clock detector 322 to the second protocol identifier. In this PLL normal mode, the PLL module 326 can be enabled to generate the pair of reference clock signals RCK_t/c as required by the memory device according to the first pair of input clock signals DCK0_A_t/c, and all of the four output buffers may be driven by the reference clock signal RCK_t/c generated by the PLL module. As shown in FIG. 6, several cycles may be required for the PLL module 326 to lock the input clock signals. Afterwards, the memory device may work based on the determined clock signals.

During the above initialization process, the input bus termination on the input clock signals is connected to the negative power supply VSS. After the detection of the input clock signals, the input bus termination may remain at VSS or change to the positive power supply VDD depending on the detection result.

It should be noted that although several steps of the method for accessing a memory system and several modules or sub-modules of the memory system are described in the above description, this division is merely exemplary rather than mandatory. In fact, according to the embodiments of the present application, features and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:

1. A clock driver, comprising:
   a clock detector for receiving a plurality pairs of input clock signals of a predetermined clocking protocol, and for generating a protocol identifier indicative of the predetermined clocking protocol by determining toggling of the plurality pairs of input clock signals;
   a phase locking loop (PLL) module coupled to receive at least one pair of the plurality pairs of input clock signals, and for generating at least one pair of reference clock signals according to the received at least one pair of input clock signal; and
   a plurality of multiplexers coupled to the clock detector and to the PLL module, wherein each multiplexer is configured for receiving one pair of the plurality pairs of input clock signals and one pair of the at least one pair of reference clock signals, and selectively outputting, according to the protocol identifier, the pair of input clock signals and the pair of reference clock signals to drive a group of memory chips.

2. The clock driver of claim 1, wherein the PLL module comprises a PLL unit, and all of the plurality of multiplexers are coupled to the PLL unit to receive the pair of reference clock signals generated by the PLL unit.

3. The clock driver of claim 1, wherein the PLL module is further coupled to the clock detector to receive the protocol identifier and configured to be enabled or disabled according to the received protocol identifier.

4. The clock driver of claim 1, wherein the clock driver further comprises:
   one or more clock trees each being coupled between one of the plurality of multiplexers and a group of memory chips and being configured for introducing an offset into the pair of reference clock signals.

5. The clock driver of claim 1, wherein each of the plurality of multiplexers comprises:
   a first input coupled to receive one pair of the plurality pairs of input clock signals;
   a second input coupled to the PLL module;
   a control node coupled to the clock detector to receive the protocol identifier; and
   an output coupled to a group of memory chips.

6. The clock driver of claim 1, wherein the clock detector is configured for generating the protocol identifier by determining whether only one pair of the plurality pairs of input clock signals is toggling or not.

7. The clock driver of claim 6, wherein each multiplexer is configured for outputting the pair of input clock signals when it is determined that not only one pair of the plurality pairs of input clock signals is toggling, and for outputting the pair of reference clock signals when it is determined that only one pair of the plurality pairs of input clock signals is toggling.

8. The clock driver of claim 1, wherein the clock driver is configured to be integrated in a memory device, and the clock detector is further configured for generating the protocol identifier after a power-on signal indicative of initialization of the memory device is received.

9. The clock driver of claim 1, wherein the predetermined clocking protocol is a memory clocking protocol without an on-board clock driver or a memory clocking protocol with an on-board clock driver.

10. The clock driver of claim 1, wherein the PLL module comprises two or more PLL units.

11. A memory device, comprising:
  a plurality groups of memory chips; and
  a clock driver, wherein the clock driver comprises:
    a clock detector for receiving a plurality pairs of input clock signals of a predetermined clocking protocol, and for generating a protocol identifier indicative of the predetermined clocking protocol by determining toggling of the plurality pairs of input clock signals;
    a phase locking loop (PLL) module coupled to receive at least one pair of the plurality pairs of input clock signals, and for generating at least one pair of reference clock signals according to the received at least one pair of input clock signals; and
    a plurality of multiplexers coupled to the clock detector and to the PLL module, wherein each multiplexer is configured for receiving one pair of the plurality pairs of input clock signals and one pair of the at least one pair of reference clock signals, and selectively outputting, according to the protocol identifier, the pair of input clock signals and the pair of reference clock signals to drive one group of the plurality groups of memory chips.

12. The memory device of claim 11, wherein the memory device is an unbuffered dual inline memory module (UDIMM) or a small outline dual inline memory module (SODIMM).

13. The memory device of claim 11, wherein the clock detector is configured for generating the protocol identifier by determining whether only one pair of the plurality pairs of input clock signals is toggling or not.

14. The memory device of claim 13, wherein each multiplexer is configured for outputting the pair of input clock signals when it is determined that not only one pair of the plurality pairs of input clock signals is toggling, and for outputting the pair of reference clock signals when it is determined that only one pair of the plurality pairs of input clock signals is toggling.

15. The memory device of claim 11, wherein the clock driver is configured to be integrated in a memory device, and the clock detector is further configured for generating the protocol identifier after a power-on signal indicative of initialization of the memory device is received.

16. A method for clocking a memory device, wherein the method comprises:
  receiving a plurality pairs of input clock signals of a predetermined clocking protocol;
  generating a protocol identifier indicative of the predetermined clocking protocol by determining toggling of the plurality pairs of input clock signals; and
  selectively outputting, according to the protocol identifier, the plurality pairs of input clock signals or a plurality of reference clock signals generated according to at least one pair of input clock signals.

17. The method of claim 16, wherein the method further comprises:
  generating, via a phase locking loop module the plurality of reference clock signals according to the at least one pair of input clock signals.

18. The method of claim 16, wherein generating a protocol identifier indicative of the predetermined clocking protocol by determining toggling of the plurality pairs of input clock signals comprises:
  determining whether only one pair of the plurality pairs of input clock signals is toggling or not.

19. The method of claim 18, wherein selectively outputting, according to the protocol identifier, the plurality pairs of input clock signals or a plurality of reference clock signals generated according to at least one pair of input clock signals comprises:
  outputting the plurality pairs of input clock signals when it is determined that not only one pair of the plurality pairs of input clock signals is toggling, and
  outputting the plurality pairs of reference clock signals when it is determined that only one pair of the plurality pairs of input clock signals is toggling.

* * * * *